United States Patent [19]

Jensen

[11] 4,287,479
[45] Sep. 1, 1981

[54] OPERATIONAL AMPLIFIER CIRCUIT

[76] Inventor: Deane E. Jensen, 1617 N. Fuller Ave., Hollywood, Calif. 90046

[21] Appl. No.: 51,230

[22] Filed: Jun. 22, 1979

[51] Int. Cl.³ .............................................. H03F 3/45
[52] U.S. Cl. .................................... 330/260; 330/294
[58] Field of Search .................. 330/69, 94, 252, 294, 330/302, 304, 306, 260

[56] References Cited

U.S. PATENT DOCUMENTS

| 3,368,157 | 2/1968 | Fumea, Jr. et al. | 330/306 |
| 3,628,168 | 12/1971 | Kobayashi | 330/252 X |
| 3,811,016 | 5/1974 | Takasaki et al. | 330/304 X |

OTHER PUBLICATIONS

Chessman, "Prevent Emitter–Follower Oscillation", *Electronic Design 13*, Jun. 21, 1976, pp. 110–113.

*Primary Examiner*—James B. Mullins
*Attorney, Agent, or Firm*—Fulwider, Patton, Rieber, Lee & Utecht

[57] ABSTRACT

An operational amplifier circuit having a first amplification stage that includes a differential pair of matches, low-noise transistors coupled in a common-emitter configuration, with a special reactive network in the emitter circuit of each transistor. Each reactive network comprises an inductor and a resistor, arranged in a shunt configuration, whereby at low frequencies the first stage has a relatively high gain and generates relatively low noise, and whereby at high frequencies the first stage has a relatively low gain and the amplifier circuit has sufficient phase margin to ensure stability.

9 Claims, 4 Drawing Figures

U.S. Patent  Sep. 1, 1981  4,287,479
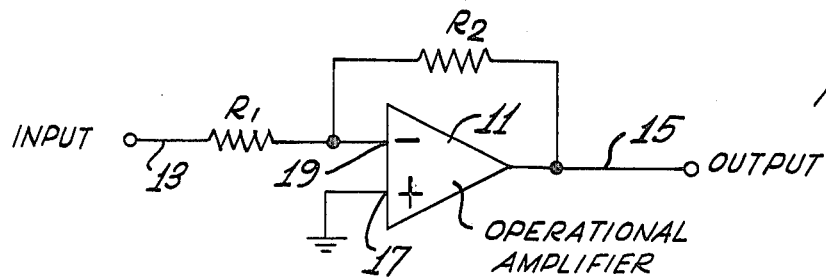
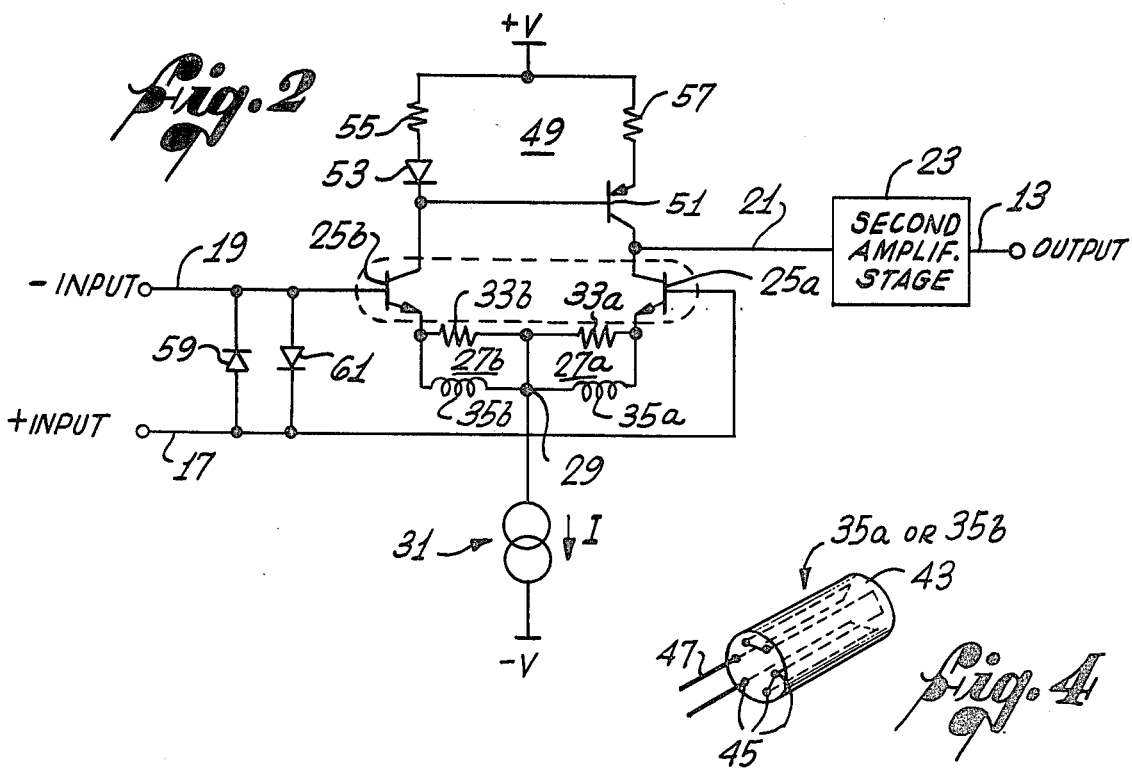
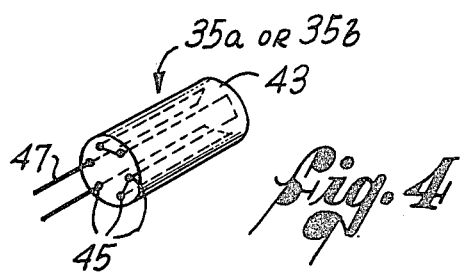
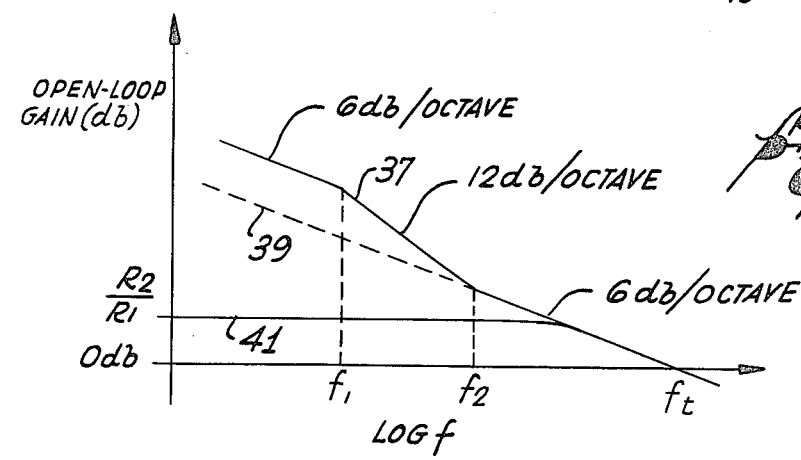

OPERATIONAL AMPLIFIER CIRCUIT

BACKGROUND OF THE INVENTION

This invention relates generally to operational amplifier (op amp) circuits and, more particularly, to op amp circuits having means for reducing the generation of noise.

In the past, op amp circuits have typically included a first amplification stage having a differential pair of matched transistors in a common-emitter configuration. The base elements of the two transistors serve, respectively, as non-inverting and inverting input terminals, and an output signal, proportional to the difference between signals being applied to the two input terminals, is produced at the collector element of one of the transistors. To ensure stability, the gain-bandwidth product of the first amplification stage must ordinarily be limited so that propagation delays in second and subsequent amplification stages won't reduce the phase margin by too much at the unity-gain frequency of the first stage.

The customary technique for limiting the gain-bandwidth product of the first amplification stage is to place a resistor in the emitter circuit of each of the two transistors. Unfortunately, these resistors have an adverse effect on the noise power generated in the first stage, since noise power density is directly proportional to the emitter resistance. Accordingly, designers have been faced with a trade-off between stability, which accompanies use of a relatively high emitter resistance, and low noise, which accompanies use of relatively low emitter resistance. In some prior devices, emitter resistors on the order of 100 ohms have been selected, which has decreased the signal-to-noise ratio by only 0.1 db over what could otherwise be obtained with no resistor at all, and which has limited the gain-bandwidth product of the first stage to an acceptable level, for purposes of stability.

With the advent of relatively low-noise transistors, such as the LM-394 dual NPN transistor produced by National Semiconductor, however, the noise produced by emitter resistors of 100 ohms can be very significant in comparison to the noise produced in the transistors themselves. One technique for properly benefiting from the low-noise capability of these transistors is to reduce the value of the emitter resistor, but, as previously discussed, such a reduction can increase the gain-bandwidth product of the first stage and thereby have an adverse effect on the stability of the op amp.

Thus, there is a need for an op amp circuit that can properly benefit from the use of relatively low-noise transistors, by generating substantially less noise without having any adverse effects on stability. The present invention fulfills this need.

SUMMARY OF THE INVENTION

Basically, the present invention is embodied in an improved operational amplifier circuit with a first amplification stage that includes a transistor having an input terminal, an output terminal, and a common terminal. In accordance with the invention, the common terminal is coupled to common via a reactive network, wherein the reactive network has a relatively low impedance at low frequencies, whereby the first stage has a relatively high gain and generates relatively low noise at such low frequencies, and wherein the network has a relatively high impedance at high frequencies, whereby the gain-bandwidth product of the first stage is sufficiently limited that stability of the op amp circuit is maintained.

More particularly, the first amplification stage includes a differential pair of matched transistors, in a common-emitter configuration, with the base elements of the respective transistors serving as non-inverting and inverting input terminals, and with the collector element of one transistor serving as an output terminal, for coupling to the input of a second amplification stage. The emitter element of each transistor is coupled through a separate reactive network to a node that is, in turn, coupled through a current source to a voltage reference level.

The reactive network associated with each emitter element preferably comprises an inductor and a resistor, coupled in a shunt configuration. Thus, at relatively high frequencies, the impedance of the network is roughly equivalent to that of the resistor and the gain of the stage is determined by the sum of each resistor and the internal emitter resistance $r_e$ of the corresponding transistor, while at relatively low frequencies, the network impedance is essentially zero and the gain of the stage is determined by the internal emitter resistance $r_e$, by itself. As a result, for frequencies less than the frequency at which the emitter resistor and inductor are equal in impedance, the stage will produce less noise and will provide an increased open-loop gain, whereby less distortion of the signal is realized. Additionally, since the presence of the inductor does not affect the impedance of the network at relatively high frequencies, i.e., at frequencies near the unity-gain frequency, $f_t$, of the op amp circuit, stability of the circuit is not adversely affected thereby.

The inductor in each reactive network must be wound in such a manner that it self-resonates at a frequency substantially greater than $f_t$. In accordance with one aspect of the present invention, the inductor is formed by threading a wire in an alternating fashion through a succession of spaced holes formed in a ferrite bead, creating the characteristics of a length of wire surrounded by a magnetic material of high permeability.

Other aspects and advantages of the present invention will become apparent from the following description of the preferred embodiment, taken in conjunction with the accompanying drawings, which disclose, by way of example, the principles of the invention.

BRIEF DESCRIPTION OF THE DRAWINGS

FIG. 1 is a simplified schematic diagram of an operational amplifier circuit connected in a conventional amplifier arrangement;

FIG. 2 is a schematic diagram of an operational amplifier circuit in accordance with the present invention;

FIG. 3 is a diagram of the open-loop response of the operational amplifier of FIG. 2; and FIG. 4 is a perspective view of one of the inductors in the operational amplifier of FIG. 2.

DESCRIPTION OF THE PREFERRED EMBODIMENT

Referring now to the drawings, and particularly to FIG. 1, there is shown an operational amplifier 11 connected in a conventional amplifier arrangement to amplify an input signal, supplied on line 13, by a factor $R_2/R_1$, and thereby produce a corresponding output signal on line 15. To achieve this gain of $R_2/R_1$, the op amp must have a very high input impedance and a very low output impedance, and the gain of the op amp must be substantially greater than $R_2/R_1$ over the frequency range of the input signal. Additionally, for stability, the open-loop gain of the op amp must decrease with frequency, and its phase shift must be substantially less than 180 degrees for all frequencies below its unity-gain frequency, $f_t$.

Referring now to FIG. 2, there is shown a schematic diagram of the first amplification stage of an op amp 11 for use in the amplifier circuit of FIG. 1. The first stage includes conventional non-inverting and inverting input terminals 17 and 19, respectively, and it operates to produce an intermediate signal that is proportional to the difference between two input signals applied to the respective input terminals. The intermediate signal is supplied over line 21 to a second amplification stage 23 for further amplification and output on line 13 as the output signal of the op amp.

The first amplification stage includes a matched pair of low-noise NPN transistors 25a and 25b, preferably an LN-394 monolithic integrated circuit manufactured by National Semiconductor. The base elements of the two transistors serve as the respective non-inverting and inverting terminals 17 and 19, and the collector terminal of the non-inverting transistor 25a produces the intermediate signal for coupling over line 21 to the second amplification stage 23. The emitter elements of the two transistors 25a and 25b are coupled through identical reactive networks 27a and 27b, respectively, to a common node 29 and, from there, through an active constant-current source 31 to a negative reference voltage $-V$. The gain of the first stage varies inversely with the impedance of the series combination of each transistor emitter element and the corresponding reactive network.

In accordance with the invention, each of the reactive networks 27a or 27b includes a resistor 33a or 33b and an inductor 35a or 35b, arranged in a shunt configuration, whereby the impedance of each network is relatively low at low frequencies, where the signal to be amplified is located, and relatively high at high frequencies, near the unity-gain frequency of the op amp 11. Since thermal noise generated in the first stage is generally proportional to the impedance of each emitter circuit, which includes the internal emitter resistance $r_e$ of the transistor in series with the reactive network, the noise level in this first stage is substantially reduced over what it would otherwise be if the network were to include only a conventional resistor. Moreover, since at frequencies near the unity-gain frequency the inductors have substantially no effect on the impedances of their respective reactive networks, no additional phase shift is realized in the first stage, over and above that which would occur if the emitter inductors were not present, so the stability of the op amp is not adversely affected by their inclusion.

FIG. 3 depicts graphically, at reference numeral 37, the open-loop gain frequency response of the op amp 11 of FIG. 2. It will be noted that, in general, the gain rolls-off at 6 db per octave, this being due primarily to the presence of reactance in the second amplification stage 23. It will also be noted that the response includes a pole located at a frequency $f_1$, and a zero at a frequency $f_2$, whereby the gain rolls off at 6 db per octave at frequencies below $f_1$, at 12 db per octave at frequencies between $f_1$ and $f_2$, and again at 6 db per octave at frequencies above $f_2$.

The zero in the gain response is due to a pole in the impedance of the transistor emitter circuit, which occurs at the frequency where the impedance of the emitter inductor 35a or 35b is equal to that of the corresponding emitter resistor 33a or 33b. Similarly, the pole in the gain response is due to a zero in the emitter circuit impedance, which occurs at the frequency where the impedance of the inductor is equal to that of the parallel combination of the corresponding resistor and the corresponding internal emitter resistance $r_e$.

The additional open-loop gain afforded by the inclusion of the emitter inductors 35a and 35b is represented in FIG. 3 as the difference between the actual open-loop response, indicated by the solid line 37, and the response for an op amp that does not include such emitter inductors, indicated by a broken line 39. One benefit from the additional open-loop gain at frequencies below $f_2$ is that distortion of the signal being amplified is substantially reduced, due to the resulting additional amount of feedback, i.e., loop gain. For example, for the amplifier configuration of FIG. 1, the amount of feedback is directly proportional to the difference between the open-loop gain 37 for the op amp 11 and the closed-loop gain, i.e., the level $R_2/R_1$ 41. Accordingly, an inspection of FIG. 3 will reveal that substantially less feedback results when using an op amp that does not include an emitter inductor (see broken line 39) than one that does (see solid line 37).

As previously mentioned, another important benefit from this circuit derives from the generation of substantially less noise at frequencies less than about $f_2$, where the emitter circuit impedance begins to be reduced. This is especially the case at frequencies below about $f_1$, where the emitter impedance is essentially equal to the internal emitter resistance $r_e$ of the transistor 25a or 25b, by itself.

In the preferred embodiment, each emitter inductor 35a or 35b is 20 microhenries and has less than about 0.03 ohms series resistance, and each emitter resistor 33a or 33b is 30 ohms. Additionally, the internal emitter resistance $r_e$ of each transistor 25a or 25b in the LM-394 transistor pair is approximately 16 ohms. Accordingly, the zero frequency ($f_1$) is approximately 85 kilohertz and the pole frequency ($f_2$) is approximately 240 kilohertz, and, for frequencies less than $f_1$, the additional open-loop gain over an op amp that includes only a resistor of 30 ohms is approximately 9 db.

Special care must be taken to construct an emitter inductor 35a or 35b that self-resonates at a frequency substantially greater than the unity-gain frequency, $f_t$, of the op amp 11. FIG. 4 depicts one suitable arrangement for the inductor, wherein the inductor includes a ferrite bead 43 having about 6 longitudinally-aligned holes 45 formed therein, with a length of #30 magnet wire 47 threaded in alternating directions through the successive holes. This essentially duplicates the inductance of a three inch wire surrounded by a magnetic material of high permeability. It will be appreciated that although the term "ferrite" is used, the bead can be advantageously formed of any magnetic material having a high resistance, whether or not it includes ferric oxide. Since each of the successive windings is spaced from the others, the arrangement provides a relatively low shunt capacitance, whereby the inductor self-resonates at a relatively high frequency, well above 10 MHz.

With reference again to FIG. 2, the first amplification stage further includes a conventional current mirror circuit 49, which includes an NPN transistor 51, a diode 53 matched to the transistor, and two equal-valued resistors 55 and 57. The circuit 49 is coupled to the respective collector elements of the two transistors 25a and 25b, and it provides both a high collector impedance for the two transistors and a high slew rate capability for the intermediate signal coupled over line 21 to the second amplification stage 23.

The first amplification stage further includes a pair of oppositely-connected diodes 59 and 61 coupled between the non-inverting and inverting input terminals 17 and 19 of the op amp 11. These diodes prevent the transistors 25a and 25b from latching-up to either the positive or negative voltage reference levels, whenever an input signal is applied having a rise time faster than the response time of the op amp. The constant-current source 31 that couples the node 29 between the two reactive networks 27a and 27b to the negative voltage reference level −V can be constructed in accordance with any of a number of conventional designs. It preferably operates at a current level of about 3 milliamps.

The second amplification stage 23 of the op amp 11 can be readily constructed in accordance with conventional design fundamentals as set forth in a number of well-known texts, including, for example, "Operational Amplifiers, Design and Applications," written by Tobey, Graeme, and Huelsman, and published by McGraw-Hill, 1971, and "Operational Amplifiers, Theory and Practice," written by Roberge and published by Wiley, 1975. The input circuit of the second amplification stage preferably has a very high input impedance, and can advantageously comprise a Darlington amplifier circuit, so that the op amp 11, and the first amplification stage in particular, can have a relatively high d.c. gain.

From the foregoing description, it should be apparent that the present invention provides an improved operational amplifier circuit wherein the first amplification stage includes a transistor amplifier having a special reactive network in its emitter circuit that has a relatively low impedance at low frequencies, where the signal to be amplified is present, and a relatively high impedance at high frequencies, near the unity-gain frequency of the op amp. As a result, noise is substantially reduced and the open-loop gain is substantially increased at such low frequencies, while stability of the op amp is substantially unaffected.

Although the invention has been described in detail with reference to its presently preferred embodiment, it will be understood by one of ordinary skill in the art that various modifications can be made without departing from the spirit and scope of the invention. Accordingly, it is not intended that the invention be limited, except as by the appended claims.

I claim:

1. For use in an operational amplifier circuit, a first amplification stage comprising:
   first and second matched transistors, each transistor having an input terminal, a common terminal, and an output terminal; and
   first and second reactive networks coupling the common terminals of said respective first and second transistors to a common node, each of said reactive networks including an inductor and a resistor arranged in a shunt configuration, whereby each network has a relatively low impedance at low frequencies and a relatively high impedance at high frequencies;
   wherein an output signal, proportional to the difference between two input signals applied to the input terminals of said respective first and second transistors, is produced at the output terminal of one of the transistors;
   wherein at frequencies less than a prescribed frequency where the impedance of each emitter inductor is equal to the impedance of the corresponding resistor, the open-loop gain of the first amplification stage is substantially increased and substantially less noise is generated; and
   wherein at frequencies greater than the prescribed frequency, the open-loop gain of the circuit is sufficiently low that stability is maintained.

2. A first amplification stage as defined in claim 1, wherein:
   for each of said first and second transistors, the base element is the input terminal, the collector element is the output terminal, and the emitter element is the common terminal; and
   the inductor in each of said first and second reactive networks includes
      a ferrite bead having a succession of spaced, substantially parallel holes formed therein, and
      a wire wound in an alternating fashion through the successive spaced holes of said ferrite bead, and
      wherein the inductor is relatively low in shunt capacitance and thereby has a self-resonant frequency substantially greater than the unity-gain frequency of the operational amplifier circuit.

3. In an operational amplifier circuit with a first amplification stage that includes a transistor having a base element that serves as an input terminal, a collector element that serves as an output terminal and an emitter element that serves as a common terminal, an improvement comprising:
   a reactive network for coupling the common terminal of said transistor to common, said reactive network including an inductor and a resistor arranged in a shunt configuration, whereby the reactive network has a relatively low impedance at frequencies less than a prescribed frequency at which the impedance of the inductor is equal to the impedance of the resistor, and said first amplification stage has a relatively high gain and generates relatively low noise at such low frequencies, and whereby the reactive network has a relatively high impedance at frequencies greater than the prescribed frequency, and the gain-bandwidth product of said first amplification stage is sufficiently limited that stability of the operational amplifier circuit is maintained;
   wherein said inductor is less than or equal to about 20 microhenries and said resistor is greater than or equal to about 30 ohms, and wherein the internal resistance of the emitter element of the transistor is substantially less than about 30 ohms;
   and wherein the inductor includes
      a ferrite bead having a succession of spaced, substantially parallel holes formed therein, and
      a wire wound in an alternating fashion through the successive spaced holes of said ferrite bead, whereby the successive windings are maintained in isolation from each other, whereby the inductor is relatively low in shunt capacitance and has a self-resonance frequency substantially greater than the unity-gain frequency of the operational amplifier circuit.

4. In an operational amplifier circuit with a first amplification stage that includes a first transistor and a second transistor, each transistor having an input terminal, an output terminal and a common terminal, an improvement comprising:

a first reactive network coupled to the common terminal of said first transistor;

a second reactive network coupled to the common terminal of said second transistor, said second reactive network substantially identical to said first reactive network; and a current source;

wherein said first and second reactive networks couple the common terminals of their respective corresponding transistors to said current source, whereby the signal appearing at the output terminal of one of said first and second transistors is proportional to the difference between two signals applied to the respective input terminals of said first and second transistors;

wherein each of said reactive networks has a relatively low impedance at low frequencies, whereby said first amplification stage has a relatively high gain and generates relatively low noise at such low frequencies;

and wherein each of said reactive networks has a relatively high impedance at high frequencies, whereby the gain-bandwidth product of the first amplification stage is sufficiently limited that stability of the operational amplifier circuit is maintained.

5. An improvement as defined in claim 4, wherein each of said reactive networks comprises an inductor and a resistor, arranged in a shunt configuration.

6. An improvement as defined in claim 5, wherein:
the base element of each transistor is the input terminal, the collector element of each transistor is the output terminal, and the base element of each transistor is the common terminal;

said first amplification stage has a relatively high gain and generates relatively low noise at frequencies less than a prescribed frequency at which the impedance of each of said inductors is equal to the impedance of the corresponding resistor; and said first amplification stage has a relatively low gain at frequencies greater than the prescribed frequency.

7. An improvement as defined in claim 6, wherein:
each of said inductors is less than or equal to about 20 microhenries;

each of said resistors is greater than or equal to about 30 ohms; and the internal resistance of the emitter element of each transistor is substantially less than about 30 ohms.

8. An improvement as defined in claim 7, wherein each of said inductors is relatively low in shunt capacitance and thereby has a self-resonance frequency substantially greater than the unity-gain frequency of the operational amplifier circuit.

9. An improvement as defined in claim 4, wherein the series combination of each transistor and its corresponding reactive network includes a zero at a prescribed frequency $f_1$ and a pole at a prescribed frequency $f_2$, $f_2$ being substantially greater than $f_1$, whereby the open-loop gain of the operational amplifier circuit includes a pole at the frequency $f_1$ and a zero at the frequency $f_2$.

* * * * *